(12) United States Patent
Chang et al.

(10) Patent No.: US 7,099,424 B1
(45) Date of Patent: Aug. 29, 2006

(54) CLOCK DATA RECOVERY WITH SELECTABLE PHASE CONTROL

(75) Inventors: Kun-Yung K. Chang, Los Altos, CA (US); Jason C. Wei, San Jose, CA (US); Donald V. Perino, North Potomac, MD (US)

(73) Assignee: Rambus Inc., Los Altos, CA (US)

( * ) Notice: Subject to any disclaimer, the term of this patent is extended or adjusted under 35 U.S.C. 154(b) by 715 days.

(21) Appl. No.: 09/941,079

(22) Filed: Aug. 28, 2001

(51) Int. Cl.
*H04L 25/38* (2006.01)

(52) U.S. Cl. .................. 375/370; 375/294; 375/327; 375/371; 375/373; 327/99; 327/277; 327/284; 714/738; 714/744

(58) Field of Classification Search ............ 375/370, 375/371, 373–376, 327, 328, 224–228, 294, 375/144, 148, 260, 267, 326, 347, 349; 327/2–3, 327/144, 147, 151, 152, 156–161, 233, 241, 327/277, 276; 714/731, 744; 365/233, 235
See application file for complete search history.

(56) References Cited

U.S. PATENT DOCUMENTS

| 5,742,798 | A | | 4/1998 | Goldrian |
| 5,799,048 | A | | 8/1998 | Farjad-Rad et al. |
| 6,008,680 | A | * | 12/1999 | Kyles et al. ............... 327/277 |
| 6,044,123 | A | | 3/2000 | Takla |
| 6,075,416 | A | | 6/2000 | Dalmia |
| 6,725,408 | B1 | * | 4/2004 | Cao et al. .................. 714/738 |

FOREIGN PATENT DOCUMENTS

| JP | 02000035831 A | 2/2000 |
| WO | WO 00/70460 A1 | 11/2000 |

OTHER PUBLICATIONS

"Cypress Applications Handbook," Cypress Semiconductor Corporation, 1996, pp. 6-26 to 6-33.
"An Integratable 1-2.5 Gbps Low Jitter CMOS Transceiver with Built in Self Test Capability," Ah-Lyan Yee, Richard Gu, et al., Symposium on VLSI Circuits Digest of Technical Papers, 1999, pp. 45-46.
"A Semidigital Dual Delay-Locked Loop," Stefanos Sidiropolous and Mark A. Horowitz, IEEE Journal of Solid-State Circuits, vol. 32, No. 11, Nov. 1997, pp. 1683-1692.

* cited by examiner

*Primary Examiner*—Khai Tran
*Assistant Examiner*—Edith Chang
(74) *Attorney, Agent, or Firm*—Vierra Magen Marcus & DeNiro LLP

(57) ABSTRACT

A clock data recovery (CDR) circuit to recover a clock signal and data signal from an input signal. The CDR circuit includes a control circuit, a select circuit and a phase adjust circuit. The control circuit generates a first control signal according to a phase relationship between the input signal and a first clock signal. The select circuit is coupled to receive the first control signal from the control circuit and coupled to receive a second control signal. The select circuit is responsive to a select signal to select either the first control signal or the second control signal to be output as a selected control signal. The phase adjust circuit is coupled to receive the selected control signal from the select circuit, the phase adjust circuit being responsive to the selected control signal to adjust the phase of the first clock signal.

31 Claims, 11 Drawing Sheets

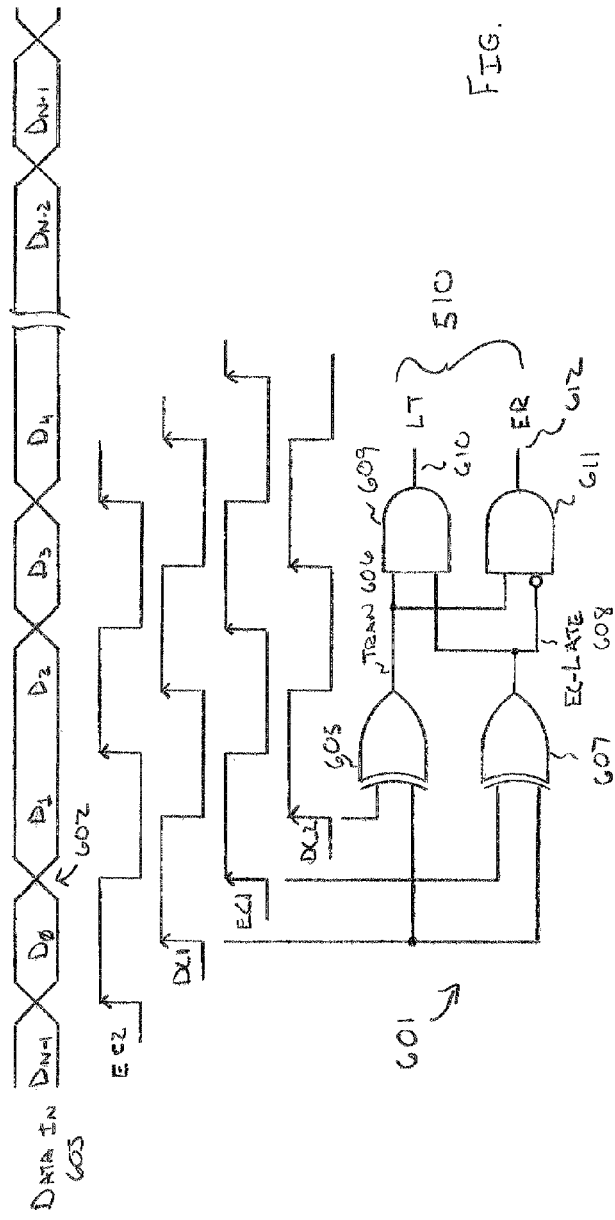
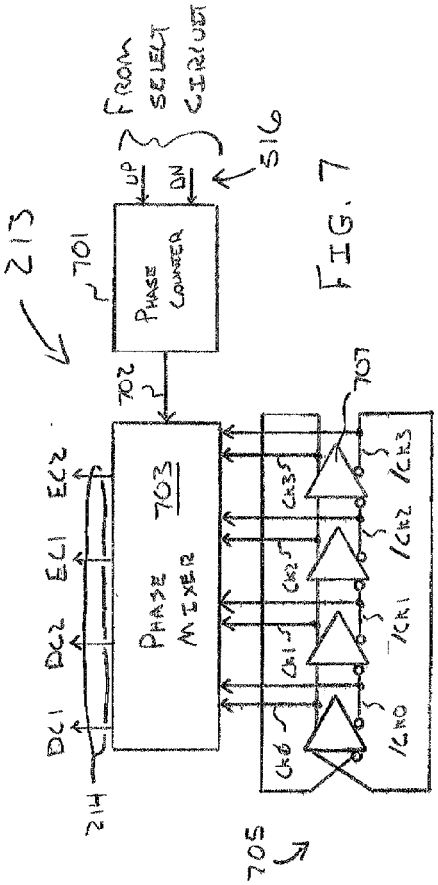
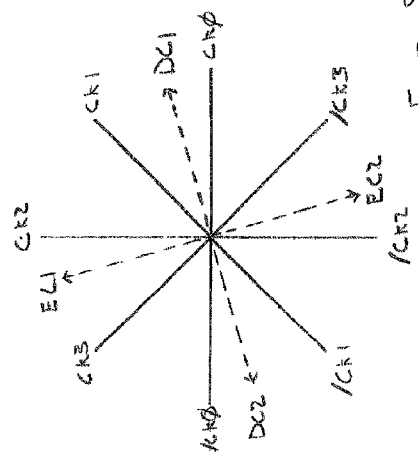
FIG. 6
FIG. 7
FIG. 8

CLOCK DATA RECOVERY WITH SELECTABLE PHASE CONTROL

FIELD OF THE INVENTION

The present invention relates to high speed signaling within and between integrated circuit devices.

BACKGROUND

Clock data recovery (CDR) circuits are often used in high speed signaling applications to recover clock and data signals from a signal line. Typically, transitions in an incoming signal are detected and used to generate a clock signal which is used, in turn, to sample data in the incoming signal.

FIG. 1 illustrates a prior art integrated circuit device 101 that includes a number of CDR circuits, $CDR_0$–$CDR_{N-1}$, to recover clock and data signals from lines $DATA_0$–$DATA_{N-1}$, respectively. Each CDR circuit includes a receiver 102 and a clock generator 103. The receiver 102 captures a number of samples of the incoming signal during each cycle of the recovered clock signal 104. The samples are compared with one another within a phase control circuit 107 (shown in the detail of clock generator 103 of $CDR_0$) to determine whether transitions in the incoming signal occur early or late relative to edges of a recovered clock signal 104. Based on the early/late determination, the phase control circuit 107 outputs a control signal to a phase adjust circuit 105 which responds by advancing or delaying (i.e., retarding) the phase of the recovered clock signal 104. Eventually, each of the CDR circuits reaches a phase locked condition in which the recovered clock signal 104 has a desired phase relationship to the incoming data signal (e.g., the recovered clock signal becomes aligned with the midpoint of the data eye), and the phase control output begins to toggle between advancing and delaying the phase of the recovered clock signal 104.

One disadvantage of the CDR arrangement in the integrated circuit 101 is that each of the signals on lines $DATA_0$–$DATA_{N-1}$ usually must undergo some minimum number of transitions per unit time (i.e., have a minimum transition density) in order for the corresponding CDR circuit to remain phase locked. Because the data content of the incoming signal may include relatively long sequences of zeroes or ones which lack such transitions, encoding, such as 8b/10b encoding, is often performed to replace the incoming data with codewords that meet the minimum transition density requirement. Because the codewords typically include more bits than the data values they replace, signal encoding tends to consume bandwidth on the signal line that could otherwise be used to transmit data. For example, in the case of 8b/10b encoding, each eight-bit data value is replaced with a 10-bit codeword, so that the encoding scheme consumes 20% of the signal line bandwidth. Other data encoding schemes also tend to consume signal line bandwidth.

SUMMARY

In various embodiments of the present invention, a select circuit is included within a clock data recovery (CDR) circuit to allow selection of either a self-generated phase control signal (i.e., a phase control circuit generated within the CDR circuit) or an externally generated phase control signal. The selected phase control signal is supplied to a phase adjust circuit within the CDR circuit to advance or retard the phase of the recovered clock signal. In one embodiment, the ability to select between self-generated and externally generated phase control enables the CDR circuit to be switched between a self-controlled CDR mode and a slave CDR mode. For a CDR circuit in the slave CDR mode, another CDR circuit (i.e., a master CDR circuit) may be used to provide the externally generated phase control signal, obviating the minimum transition density requirement of the data signal supplied to the slave-mode CDR circuit. As discussed below, multiple CDR circuits may initially be set to a self-controlled CDR mode to achieve phase lock (each CDR circuit having a respective phase offset according to the link characteristics), then all but one of the CDR circuits may be switched to a slave CDR mode in which the phase control signal from a master CDR circuit (the one CDR circuit left in self-controlled CDR mode) is used to control further phase adjustments in the slave mode CDR circuits. By this arrangement, signals input to all but one of the CDR circuits are relieved from the minimum transition density requirement. By selecting the master CDR circuit to be one in which the input data signal naturally meets the minimum transition density requirement (e.g., the input data signal is a reference clock signal), the available bandwidth on the remaining signal lines may be fully utilized. That is, no bandwidth-consuming encoding is needed to maintain phase lock in the slave mode devices.

As discussed below, providing a selection circuit to select between self-controlled CDR mode and slave CDR mode also enables the CDR circuit to be tested in a number of ways including, without limitation, phase testing and cycle testing of the CDR circuit.

These and other features and advantages of the present invention are described in the detailed description below.

BRIEF DESCRIPTION OF THE DRAWINGS

The present invention is illustrated by way of example, and not by way of limitation, in the figures of the accompanying drawings and in which like reference numerals refer to similar elements and in which:

FIG. 6 illustrates an embodiment of a circuit that may be used within the sequence detection circuit FIG. 5 to generate an early/late indicator;

FIG. 7 illustrates a phase adjust circuit according to one embodiment;

FIG. 8 is a phase diagram of exemplary clock signals generated within the phase adjust circuit of FIG. 7;

DETAILED DESCRIPTION

Figure 1:
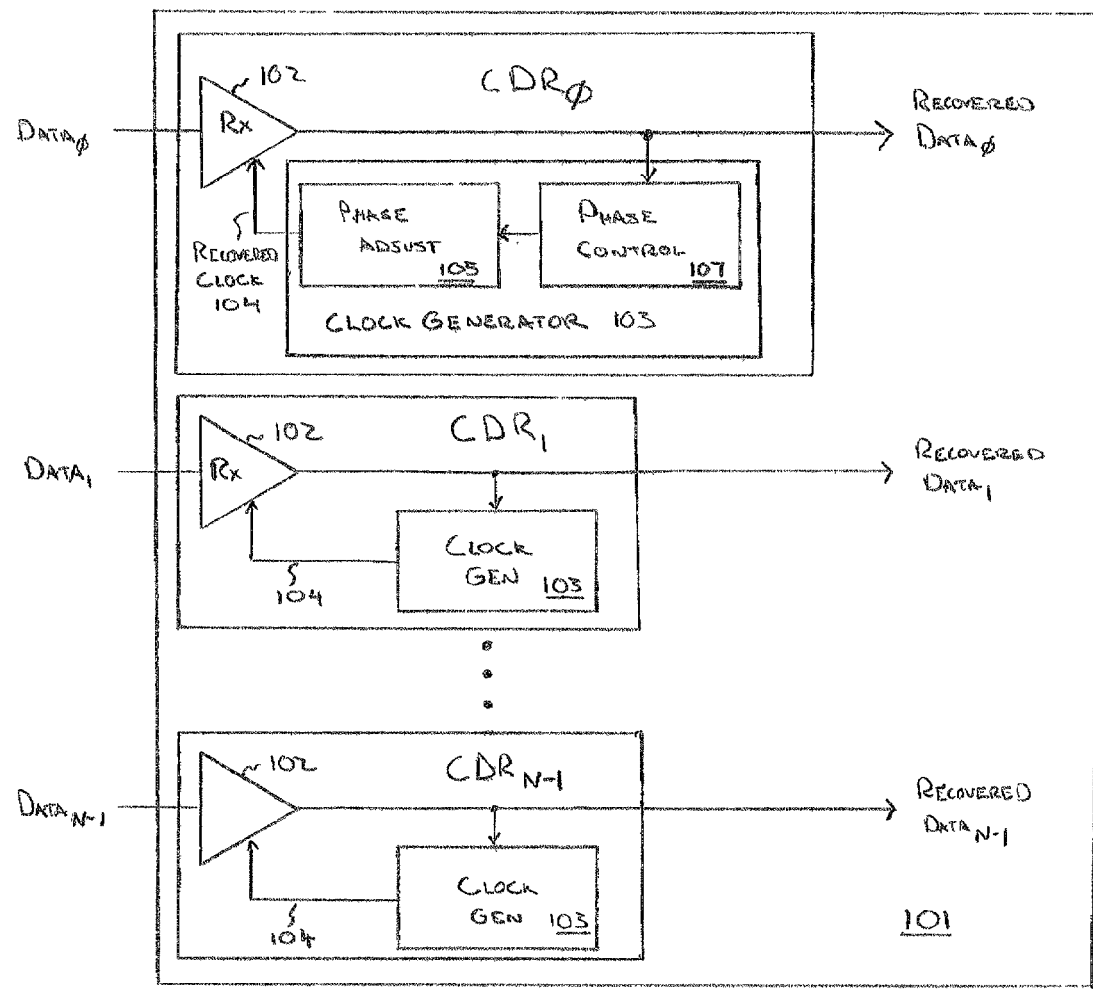
FIG. 1 illustrates a prior art integrated circuit device that includes multiple CDR circuits.
Figure 2:
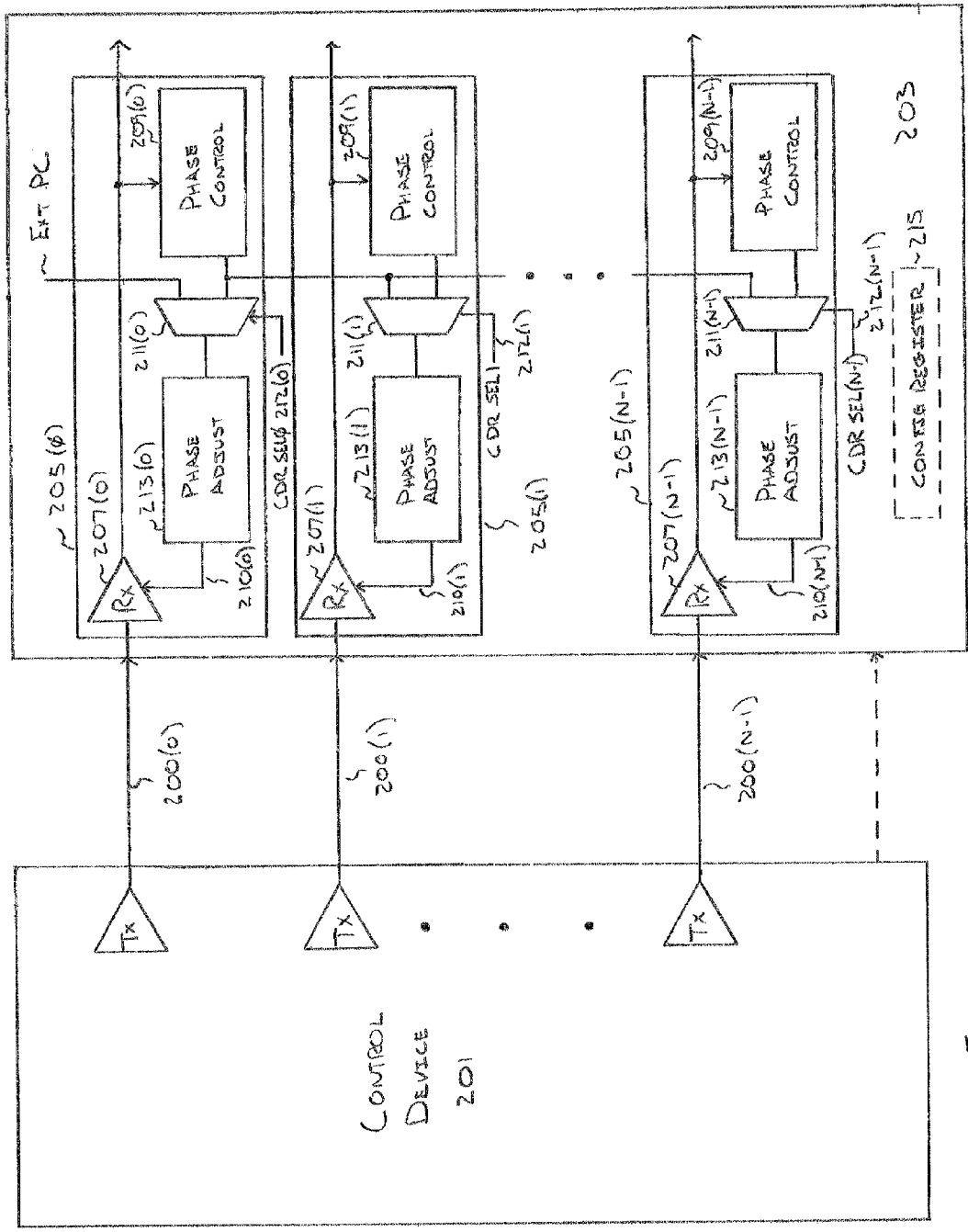
FIG. 2 illustrates a signaling system which includes a master-slave CDR arrangement according to one embodiment of the invention.

Master-Slave CDR Operation FIG. 2 illustrates a signaling system which includes a master-slave CDR arrangement according to one embodiment of the invention. A control device 201 transmits data to a recipient device 203 by outputting signals onto N signal lines 200(0)–200(N–1), N being an integer. The signal lines 200 may be electrical or optical conductors and the signals conducted by the signal lines 200 may be generated using any number of signaling techniques including without limitation, modulating the voltage or current level of an electrical signal or modulating the intensity or other characteristics of an optical signal. The signals may represent any type of control and timing information (e.g., commands, address values, clock signals, configuration information) as well as data. All such information-carrying signals (i.e., control, timing and data signals) are referred to herein as data signals.

The recipient device 203 includes N CDR circuits 205(0)–205(N–1), each including a respective receive circuit 207(0)–207(N–1), phase control circuit 209(0)–209(N–1) and a phase adjust circuit 213(0)–213(N–1). Each receive circuit 207(0)–207(N–1) samples an incoming data signal in response to a respective recovered clock signal 210(0)–210(N–1). The samples of the incoming data signal are compared with one another in the corresponding phase control circuit 209 to determine whether the transitions in the data signal are early or late relative to the recovered clock signal 210. If the data signal transitions are determined to be early relative to the recovered clock signal 210, the recovered clock signal 210 is deemed to lag the incoming data signal and the phase control circuit 209 asserts a control signal to advance the phase of the recovered clock signal 210. Conversely, if the data signal transitions are determined to be late relative to the recovered clock signal 210, the recovered clock signal 210 is deemed to lead the incoming data signal, and the phase control signal asserts a control signal to delay (i.e., retard) the phase of the recovered clock signal 210.

Each of the select circuits 211(0)–211(N–1) is used to select between the self-generated phase control signal (i.e., the control signal generated by the corresponding phase control circuit 209(0)–209(N–1)) and an externally generated phase control signal More specifically, when a CDR select signal 212(0)–212(N–1) corresponding to one of the CDR circuits 205(0)–205(N–1) is in a first state, a self-controlled mode is selected for the CDR circuit 205 and the self-generated phase control signal is output to the phase adjust circuit 213. Conversely, when the CDR select signal 212 is in a second state, a slave mode is selected for the CDR circuit 205 and the externally generated phase control signal is output to the phase adjust circuit 213.

The phase adjust circuit 213 within each CDR circuit 205 responds to the selected phase control signal by advancing the phase of the recovered clock signal 210 if the selected phase control signal is in a phase advance state and by delaying the phase of the recovered clock signal if the selected phase control signal is in a phase delay state.

Still referring to the recipient device 203, the output of the phase control circuit 209(0) is coupled to the external CDR input of each of the select circuits 211(1)–211(N–1). Accordingly, when the CDR select signals 212(1)–212(N–1) select the slave mode, the phase control circuit 209(0) is used to control the phase of each of the recovered clock signals 210(0)-210(N-1). That is, CDR circuit 205(0) acts as a master CDR circuit and CDR circuits 205(1)–205(N–1) act as slave CDR circuits. Because the outputs of phase control circuits 209(1)–209(N–1) are not being used (i.e., when the corresponding CDR circuit 205(1)–205(N–1), the signals present on signal lines 200(1)–200(N–1) are no longer required to meet the minimum transition density in order for the CDR circuits 205(1)–205(N–1) to remain in phase lock. Also, because the phase control circuits 209(1)–209(N–1) are not being used to provide phase control, those circuits may be disabled to conserve power.

In one embodiment, the CDR select signals 212(0)–212(N–1) are output from the control device 201 directly to the external phase control inputs of the select circuits 211(0)–211(N–1). Alternatively, a configuration register 215 may be provided within the recipient device to control the state of the CDR select signals 212(0)–212(N–1). The configuration register 215 may be run-time programmed (i.e., loaded after device power-up) with a configuration value supplied by the control device 201, for example, in response to a load command issued from the control device 201 to the recipient device 203. The configuration register 215 may be designed to default to a predetermined mode upon device power up (e.g., all CDR circuits initialize to self-controlled mode). In another embodiment, each of the select circuits 211(1)–211(N–1) may be controlled by a single CDR select signal (e.g., supplied from a configuration register, from the control device 201, or from another source) so that each of the CDR circuits 205(1)–205(N–1) is transitioned from self-controlled mode to slave mode in response to the same signal.

Figure 3:
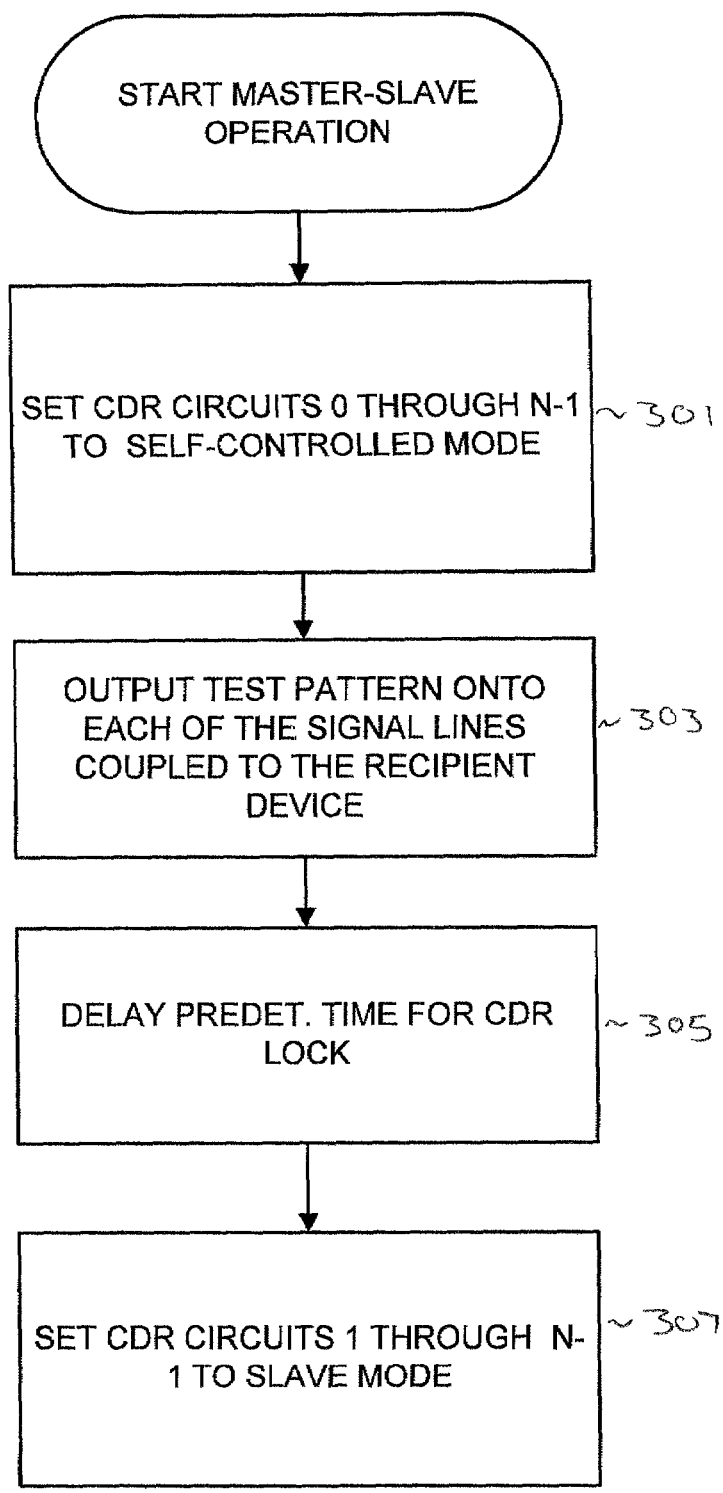
FIG. 3 illustrates the actions of a control device to initialize a recipient device for master-slave CDR operation.

FIG. 3 illustrates the actions of the control device 201 to initialize the recipient device 203 for master-slave CDR operation. At block 301 the control device sets each of the CDR circuits (0 through N–1) within the recipient device to the self-controlled mode. At block 303, the control device outputs a training sequence (i.e., a test signal having a predetermined pattern such as 0, 1, 0, 1, . . . ) onto each of the signal lines coupled to CDR circuits within the recipient device to allow the CDR circuits to attain phase lock. Note that the operations of blocks 301 and 303 may occur in any order or at the same time. After setting the CDR circuits in the recipient device to self-controlled mode and initiating transmission of the training sequences, the control device delays for a predetermined time interval (as shown by block 305) to allow the CDR circuits to attain phase lock. During this time interval, the CDR circuits attain phase lock at respective phase offsets, effectively self-calibrating to compensate for timing variations between the incoming signal lines and timing variations between the CDR circuits themselves. That is, each CDR circuit may attain phase lock at a different phase offset from the other CDR circuits according to the particular characteristics of the incoming signal line and the CDR circuit itself. In some applications, the timing variations between the signal lines and the CDR circuits are relatively static so that the self-controlled mode of operation need only be selected at initial power-up. In other applications (e.g., applications in which changing temperature and/or voltage produces per-link timing offsets), it may be desirable to set the CDR circuits to self-controlled mode to compensate for timing variations either periodically or upon detection of certain conditions. For example, the CDR circuits may be set to self-controlled mode upon detecting a change in temperature or supply voltage, or upon detecting a loss of synchronization (e.g., detecting a threshold error rate in an error checking circuit within the integrated circuit device).

Still referring to block 303 of FIG. 3, rather than delay for a predetermined time, the control device may receive one or more status signals from the recipient device indicating that the CDR circuits have attained phase lock. For example, each of the CDR circuits within the recipient device may include logic circuitry to detect when the output of the phase control circuit begins to toggle between advancing and delaying the phase of the corresponding recovered clock signal and, in response, to generate a phase lock signal to indicate the phase locked condition. The phase lock signal from each of the CDR circuits may be output to the control device directly or via a status word read by the control device so that the control device may detect when all the CDR circuits within the recipient device have attained phase lock. In an alternative embodiment, the phase lock signals from each CDR circuit may be logically ANDed to generate a device level phase lock signal. The device level phase lock signal may then be output directly to the control device 201 or via a status word.

Still referring to FIG. 3, once each of the CDR circuits has attained phase lock, the control device sets CDR circuits 1 through N−1 to the slave mode (e.g., CDR circuits 205(1)–205(N−1) of FIG. 2). The recipient device is now configured for master-slave CDR operation, and signals input to the slave-mode CDR circuits are no longer required to have a minimum transition density in order for the slave-mode CDR circuits to remain in phase lock. In contrast to the prior art encoding schemes discussed above in which data words are encoded into larger codewords prior to transmission, the full bandwidth of each signal line coupled to a slave mode CDR circuit is available for data transmission.

Referring again to FIG. 2, it should be noted that the commands and/or control signals used to initialize the recipient device 203 for master-slave CDR operation may be issued by a device other than the control device 201. For example, another device (not shown in FIG. 2) may output the CDR select signals 212 (or issue a configuration value and configuration load command) to the recipient device 203 while the device 201 outputs signals to the recipient device via signal lines 200. Also, while recipient device has been described in terms of its receive capability, numerous other circuit blocks may be included within the recipient device, including transmit circuits that transmit signals on signal lines 200 (or other signal lines) to be received by corresponding CDR circuits in the control device. For example in one embodiment, the control device and the recipient device are each SerDes (serialize/deserialize) devices that communicate via high-speed serial data streams output onto signal lines 200 (each link 200 may be bidirectional or dedicated to a given transmission direction). Deserializing circuitry within each device is used to convert the incoming serial data into parallel form for use by other circuitry within the device.

Still referring to FIG. 2, it may be known in advance that CDR circuit 205(0) is to be operated as the master CDR circuit for a given application. In that case, the select circuit 211(0) the signal line to carry CDR select signal 212(0) may be omitted (i.e., the output of phase control circuit 209(0) may be coupled directly to the input of phase adjust circuit 213(0)). Alternatively, the external phase control input to select circuit 211(0) may be provided for test purposes. Similarly, the select circuits 211(1)–211(N−1) may each (or any one of them) include an additional input port coupled to a test signal line for test purposes. Use of the select circuit 211 to allow CDR circuit testing is described below in further detail.

Figure 4:
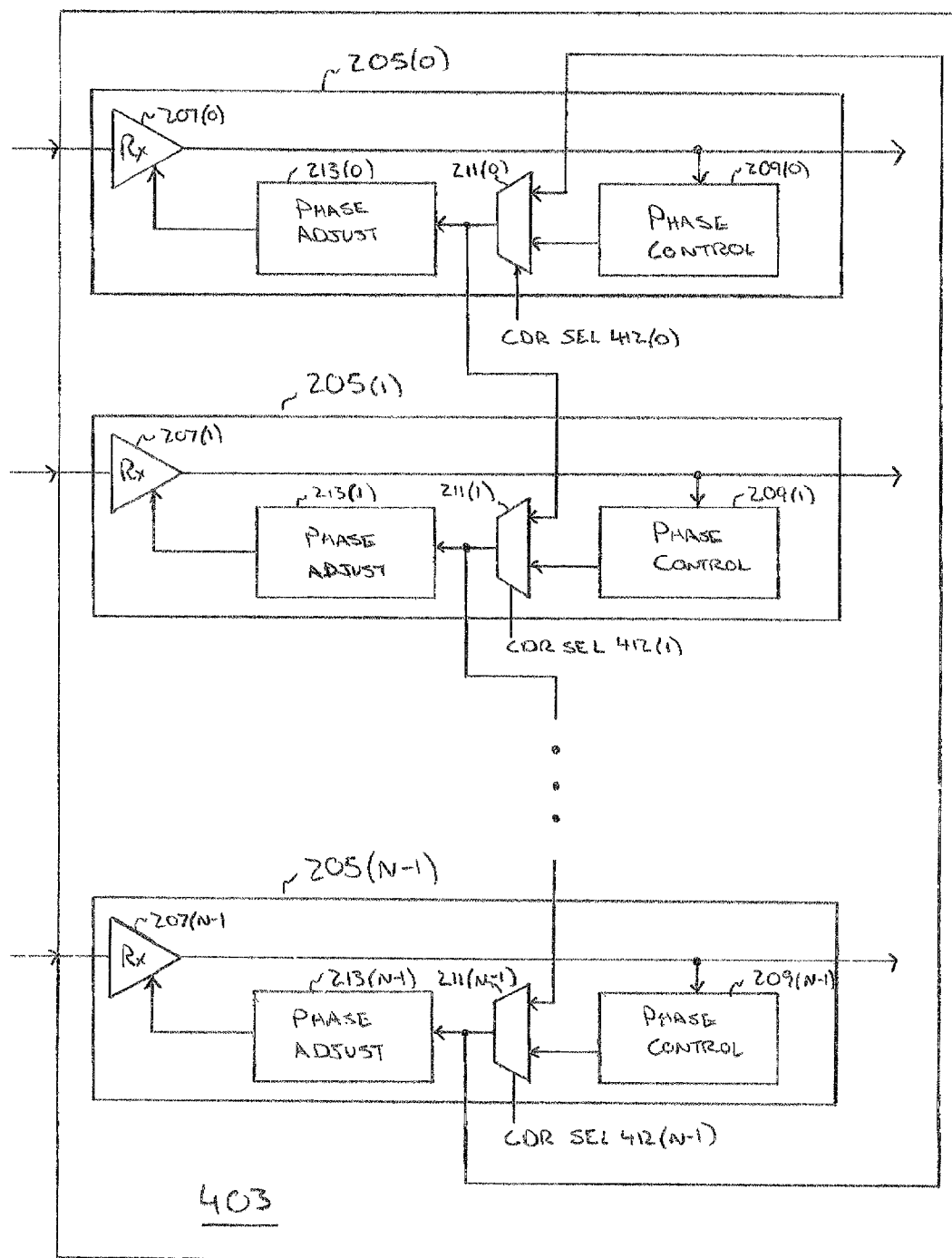
FIG. 4 illustrates an alternative embodiment of a recipient device in which any of a number of CDR circuits may be operated as a master CDR circuit.

FIG. 4 illustrates an alternative embodiment of a recipient device in which any one of the CDR circuits 205(0)–205(N−1), or more than one of the CDR circuits, may be operated as a master CDR circuit. The receiver circuits 207(0)–207(N−1), phase control circuits 209(0)–209(N−1) and phase adjust circuits 213(0)–213(N−1) all operate as described above in reference to FIG. 2. The select circuits 211(0)–211(N−1) also operate as described above in reference to FIG. 2, except that the external phase control input of each select circuit is coupled to the phase control output of the select circuit of another of the CDR circuits. In the embodiment of FIG. 4, for example, the output of select circuit 211(0) is coupled to the external phase control input of select circuit 211(1), the output of select circuit 211(1) is coupled to the external phase control input of select circuit 211(2) and so forth, with the output of select circuit 211(N−1) being coupled to the external phase control input of select circuit 211(0). By this arrangement, any of the CDR circuits may be programmed (e.g., by programmable register or by assertion of the appropriate CDR select signal 412) to be a master CDR circuit. For example, by setting CDR circuit 205(1) to self-controlled mode and each of the other CDR circuits to slave mode, CDR circuit 205(1) becomes the CDR master for each of the other CDR circuits. Alternatively, two or more of the CDR circuits may be programmed to be masters of subsets of the remaining CDR circuits. For example, if there are sixteen CDR circuits 205(0)–205(15), half of the CDR circuits could be operated as a first set of master-slave CDR circuits (e.g., by setting CDR circuit 205(0) to self-controlled mode and CDR circuits CDR circuits 205(1)–205(7) to slave mode) and the other half of the CDR circuits operated as a second set of master-slave CDR circuits (e.g., by setting CDR circuit 205(8) to self-controlled mode and CDR circuits 205(9)–205(15) to slave mode). Other master-slave configurations may readily be achieved according to application requirements.

CDR Circuit

Figure 5:
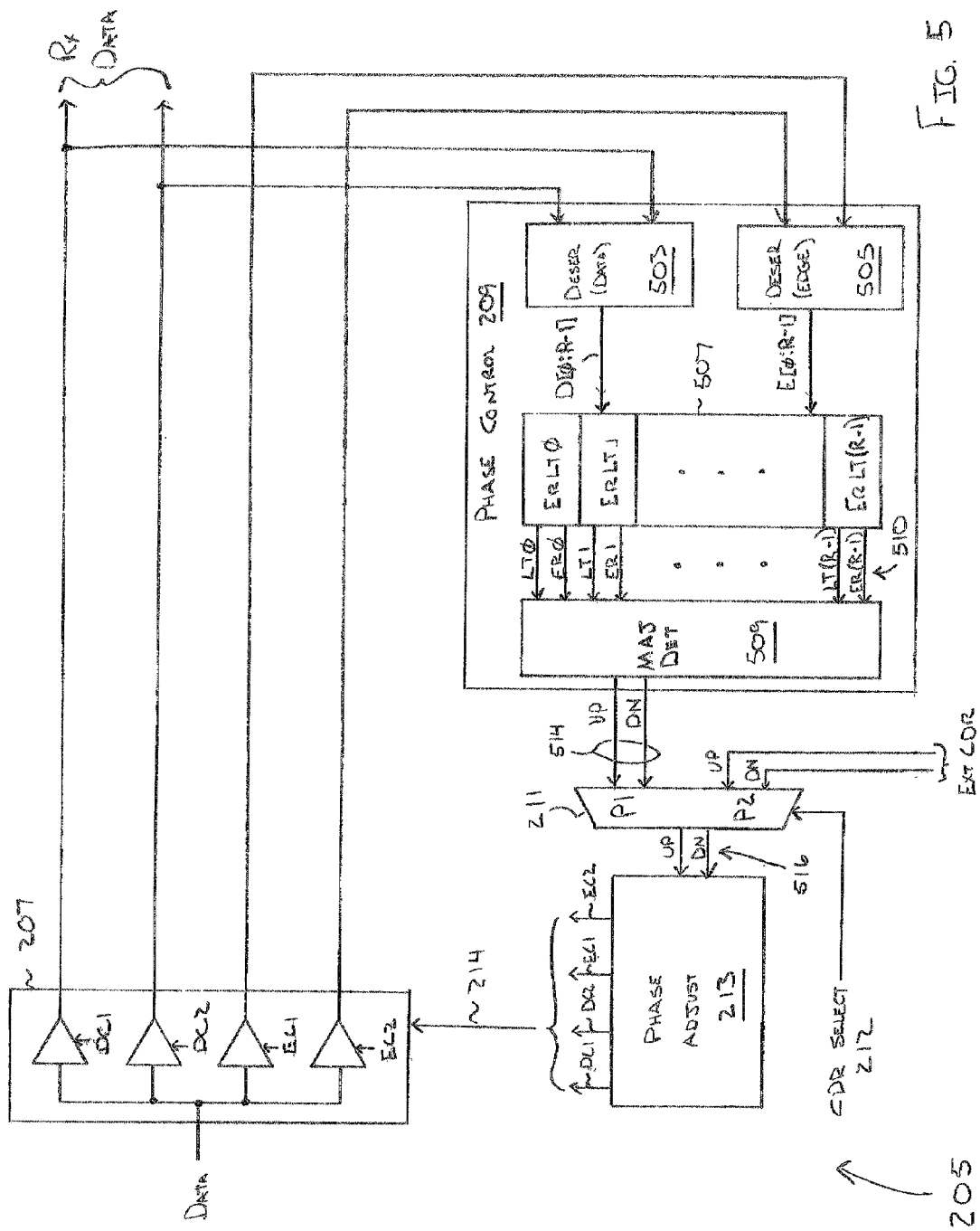
FIG. 5 is a block diagram of a CDR circuit according to a digital embodiment.

FIG. 5 is a block diagram of a CDR circuit 205 according to a digital embodiment. As shown, the phase adjust circuit 213 generates a recovered clock signal 214 having four component clock signals: data clock DC1, data clock DC2, edge clock EC1 and edge clock EC2. The receive circuit 207 includes four receivers which sample the incoming data signal in response to transitions in the respective component clock signals DC1, DC2, EC1 and EC2. The data signal samples captured in response to the data clocks DC1 and DC2 are input to a data deserializing circuit 503 (i.e., data deserializer) and are also output from the CDR circuit as receive data (RX DATA). The data signal samples captured in response to the edge clocks EC 1 and EC2 are input to an edge deserializer 505. In one embodiment, each of the deserializing circuits 503 and 505 is a shift register that loads data signal samples captured over an interval of R/2 clock cycles, R being an integer or a fractional value. For example, if R is five, then the data deserializer and edge deserializer would each contain ten data samples as follows:

| Data Deserializer | Edge Deserializer |
|---|---|
| cycle 0: DC1 sample | cycle 0: EC1 sample |
| cycle 0: DC2 sample | cycle 0: EC2 sample |
| cycle 1: DC1 sample | cycle 1: EC1 sample |
| cycle 1: DC2 sample | cycle 1: EC2 sample |
| cycle 2: DC1 sample | cycle 2: EC1 sample |
| cycle 2: DC2 sample | cycle 2: EC2 sample |
| cycle 3: DC1 sample | cycle 3: EC1 sample |
| cycle 3: DC2 sample | cycle 3: EC2 sample |
| cycle 4: DC1 sample | cycle 4: EC1 sample |
| cycle 4: DC2 sample | cycle 4: EC2 sample |

The outputs of the deserializing circuits are input to a detection circuit 507 which includes circuitry to generate an early/late indicator 510 for each of the R entries in the deserializing circuits 503 and 505. In one embodiment, each early/late indicator 510 includes an early signal (designated ER0–ER(R−1) in FIG. 5) and a late signal (designated LT0–LT(R−1) in FIG. 5). As discussed below, the early signal, when asserted, indicates that a transition in the data signal occurred after a transition in one of the edge clock signals. That is, the edge clock transitioned early relative to the data signal transition. The late signal, when asserted indicates that a transition in the data signal occurred prior to a transition in one of the edge clock signals. That is, the edge clock transitioned late relative to the data signal transition. In one embodiment, both the early and late signals remain unasserted when there is no transition in the data signal.

A majority detection circuit 509 receives the R early/late indicators 510 from the detection circuit 507 and, in response, generates a phase control signal 514 according to whether a majority of the early/late indicators 510 indicate a late edge clock transition or an early edge clock transition. In the embodiment of FIG. 5, the phase control signal 514 includes an up-count component (UP) and a down-count-component (DN) which are generated as follows:

| Condition | Up-Count | Down-Count |
|---|---|---|
| Majority of early/late indicators indicate early edge clock transition | 0 | 1 |
| Majority of early/late indicators indicate late edge clock transition | 1 | 0 |
| No majority | 0 | 0 |

Still referring to FIG. 5, the phase control signal 514 is input to a first port (labeled "P1") of the select circuit 211, while the second port (labeled "P2") of the select circuit 211 is coupled to receive a phase control signal from an external source. As discussed, the select circuit 211 outputs a selected phase control signal 516 (i.e., either the phase control signal 514 or the externally generated phase control signal) according to a CDR select signal 212. The selected phase control signal 516 is supplied to the phase adjust circuit 213 which adjusts the phase of the component clock signals (i.e., DC1, DC2, EC1 and EC2) of the recovered clock signal 214 accordingly.

FIG. 6 illustrates an embodiment of an early/late circuit 601 that may be used within the detection circuit 507 of FIG. 5 to generate an early/late indicator 510. As shown in FIG. 6, the edge clock signals EC1 and EC2 are edge aligned with transitions in an incoming data signal 603 and quadrature aligned with the data clock signals DC1 and DC2 (i.e., phase offset by ±90 degrees from each of the data clock signals).

By this arrangement, transitions in the data clock signals occur at the midpoint of the data eye (i.e., midway between the start and end of a valid data interval), the DC1 clock signal occurring at the midpoint of a data eye during a first half clock cycle, and the DC2 clock signal transitioning at the midpoint of a data eye during a second half clock cycle.

Exclusive OR gate 605 compares the samples of the data signal 603 captured in response to the DC1 and DC2 clock signals (referred to as DC1 and DC2 samples, respectively) to determine if the data signal 603 changed state (e.g., 0→1 or 1→0) in the time between the samples. In the example of FIG. 6, the data signal 603 does change state between the DC1 and DC2 samples as shown by the transition 602 between D0 and D1. Accordingly, the DC1 and DC2 samples have different values, causing logic gate 605 to assert a transition signal 606 (i.e., indicating that a transition has occurred). The EC1 and DC1 samples are compared in exclusive OR gate 607 to generate an EC-late signal 608 indicative of whether the EC1 signal transitioned before or after the data signal transition 602. If the EC1 transition trails the data signal transition, then the EC1 sample will be different from the DC1 sample and the exclusive OR gate 607 will assert the EC-late signal 608. Conversely, if the EC1 transition precedes the data signal transition, then the EC1 sample will be the same as the DC1 sample and the exclusive OR gate 607 will deassert the EC-late signal 606.

The transition signal 606 is input to each of a pair of AND logic gates 609 and 611. The EC-LATE signal 608 is also input to AND logic gate 609 and, after being inverted, to AND logic gate 611. Accordingly, if a data signal transition has occurred between the DC1 and DC2 samples, and the EC1 transition trails the data signal transition (i.e., both transition signal 606 and EC-late signal 608 are asserted), then AND logic gate 609 will assert late signal 610. Conversely, if a data signal transition has occurred between the DC1 and DC2 samples, and the EC1 transition precedes the data signal transition (i.e., transition signal 606 is asserted and EC-late signal 608 is deasserted), then AND logic gate 611 will assert the early signal 612. If the transition signal 606 is not asserted, then neither the early signal 612 nor the late signal 610 is asserted. Together the early signal 612 and the late signal 61 form the early/late indicator 510 discussed above in reference to FIG. 5.

In one embodiment, the detection circuit 507 of FIG. 5 includes R instances of the early/late circuit 601 of FIG. 6 to generate, in parallel, early/late indicators 0 through R−1. Half of the early/late circuits are coupled to the DC1, EC1 and DC2 signals as shown in FIG. 6 to generate early/late indicators for transitions in the data signal that should be aligned with EC1, while the other half of the early/late circuits are coupled to the DC2, EC2 and DC1 signals (with the DC2 signal being coupled to both exclusive OR gates 605 and 607 and the DC1 signal being coupled only to exclusive OR gate 605) to generate early/late indicators for transitions in the data signal that should be aligned with EC2.

FIG. 7 illustrates a phase adjust circuit 213 according to one embodiment. As shown, a selected phase control signal 516 (including an up-count component and down-count component) is input to a phase counter 701 which, in turn, outputs a phase count 702 to a phase mixing circuit 703. The phase mixing circuit 703 includes circuitry to select, according to the phase count 702, a pair of clock signals from among eight clock signals generated by a clock generating circuit 705. In one embodiment, the clock generating circuit 705 includes four delay elements 707 each selected (or controlled) to delay a complementary pair of input clock signals by 45 degrees (one eighth of a clock cycle) such that, as shown in FIG. 8, the eight output clock signals CK0, CK1, CK2, CK3, /CK0, /CK1, /CK2 and /CK3 define eight octants within a 360 degree cycle. That is, each pair of phase-adjacent clock signals defines a 45 degree octant. (The '/' symbol is used herein to indicate inversion so that, for example, CK0 and /CK0 are complementary signals).

In one embodiment, the phase count 702 is an eight bit value with the most significant three bits being used to select one pair of octant-defining clock signals (referred to as phase vectors) and the least significant five bits being used to interpolate between vectors in equal, steps of 1.40625 degrees each (i.e., 45 degrees/($2^5$)) to generate the recovered clock signal 214. Referring to FIG. 8, the DC1 component of the recovered clock signal 214 may be generated, for example, by a phase count that selects and interpolates between clock signals CK0 and CK1. The EC1, DC1 and EC2 components may be generated by interpolating every other phase vector pair using the same five-bit phase interpolation value. Thus the DC1, EC1, DC2, and EC2 clock signals may be generated as follows:

DC1: select octant indicated by phase count
    interpolate bounding vectors of selected octant per phase interpolation value
EC1: select octant indicated by phase count+2
    interpolate bounding vectors of selected octant per phase interpolation value
DC2: select octant indicated by phase count+4
    interpolate bounding vectors of selected octant per phase interpolation value
EC2: select octant indicated by phase count+6
    interpolate bounding vectors of selected octant per phase interpolation value Although the phase control circuit 209 and the phase adjust circuit 213 have been described in terms of a particular digital embodiment, the circuits may be implemented in numerous different ways. To start, the phase count (i.e., signal 702 of FIG. 7) may include more or fewer bits, with the vector selection portion of the count selecting between more or fewer than eight vector pairs, and the phase interpolation portion of the count defining more or fewer than 32 interpolation steps. Also, as shown in FIG. 6, the data clocks DC1 and DC2 are complements of one another (i.e., 180 degrees out of phase) and used to sample the incoming data signal on respective halves of a clock cycle (i.e., double data rate operation). In alternative embodiments, only one sample may be captured per clock cycle, and clock signal DC2 omitted (i.e., single data rate operation). More generally, an input data signal may be sampled at any data rate (e.g., single, double, quad, etc.) without departing from the scope of the present invention. Further, instead of a digital phase control signal (e.g., up-count/down-count signals) an analog phase control signal may be generated to control an analog phase adjust circuit such as a voltage controlled oscillator.

Configuration Register

Figure 9:
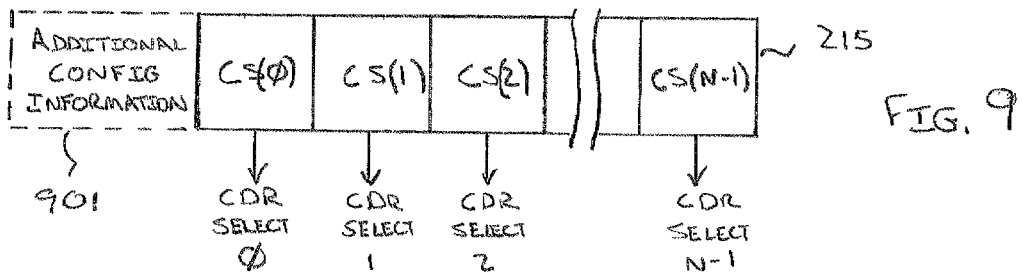
FIG. 9 illustrates an embodiment of a configuration register that may be used within the device of FIG. 2 or the device of FIG. 4.

FIG. 9 illustrates an embodiment of a configuration register 215 that may be used within the recipient device 203 of FIG. 2 or device 403 of FIG. 4. As shown in FIG. 9, the configuration register 215 may include storage for N CDR select bits, CS(0)–CS(N−1) one to drive each of the N CDR select signals. The configuration register 215 may further include storage 901 for additional configuration information that may be useful in device testing as discussed below.

CDR Circuit Testing

Figure 10:
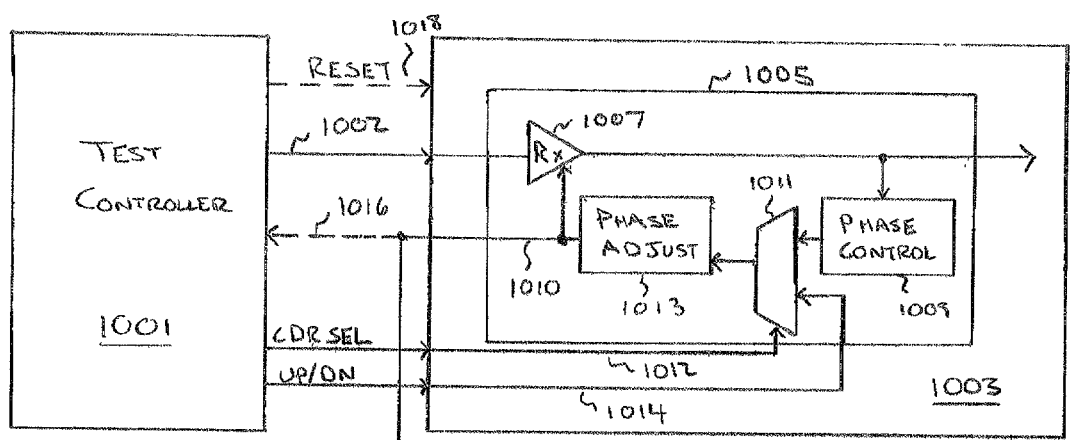
FIG. 10 illustrates a test system in which a test controller is used to test a device that includes a CDR circuit according to an embodiment of the present invention.
Figure 10:
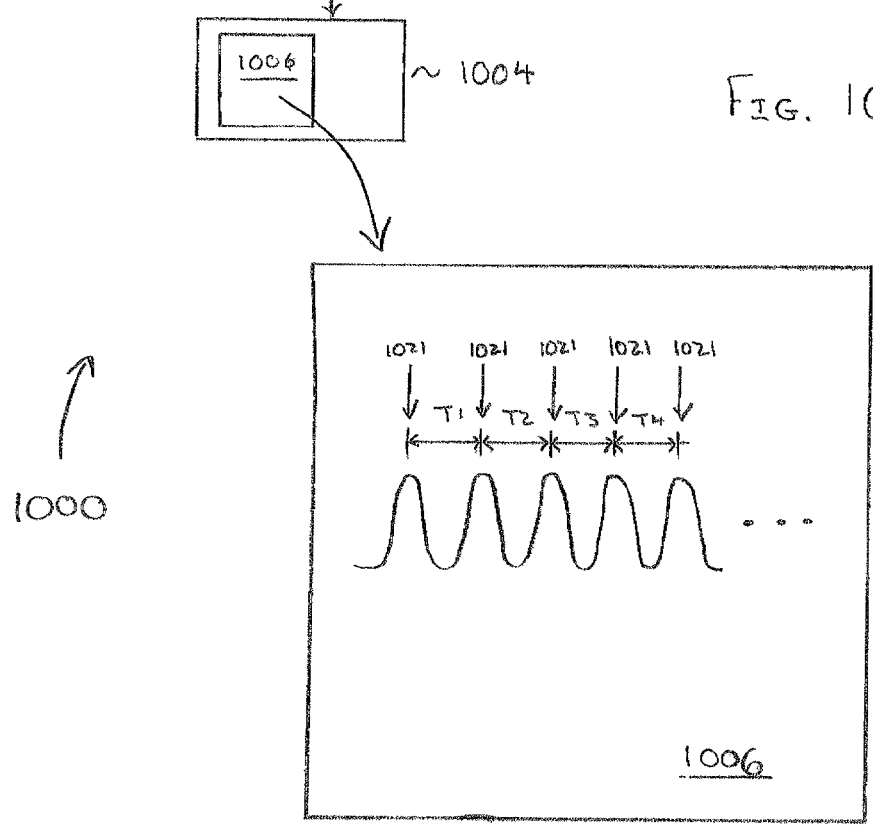

FIG. 10 illustrates a test system 1000 in which a test controller 1001 is used to test a device 1003 (the test device) that includes a CDR circuit 1005 according to an embodiment of the present invention. More specifically, the test controller 1001 outputs a CDR select signal 1012 to the CDR select input of a select circuit 1011 within the CDR circuit 1005 to place the CDR circuit 1005 in a slave mode. The test controller 1001 also outputs a phase control signal 1014 to the external phase control input of the select circuit 1011. The recovered clock signal 1010 is output from the test device 1003 and received by a signal measuring device 1004 (and additionally (or alternatively) by the test controller 1001 as shown by dashed line 1016). In one embodiment, the test device 1003 is an integrated circuit and the test controller 1001 is a general purpose test device (e.g., automated test equipment (ATE)). Alternatively, the test controller 1001 may also be an integrated circuit device (e.g., to run a built in self test within a system application), or a device that is incorporated into the same integrated circuit or integrated circuit package as the test device 1003. The signal measuring device 1004 is preferably a device for illustrating a time-based voltage waveform, such as an oscilloscope, but may be any device which can capture samples the recovered clock signal 1010 may be used.

One application of the test system 1000 is to perform a phase test on the phase adjust circuit 1013 of the CDR circuit 1005. A phase test is useful, for example, for determining whether the phase adjust circuit 1013 is capable of generating clock signals whose phases are spaced evenly throughout a clock cycle. For example, if the phase adjust circuit 1013 is intended to subdividing a clock cycle into 256 phases, then a phase test may be used to determine whether the generated clock signals, in fact, represent an evenly spaced distribution of 256 phase offsets within a clock cycle.

Figure 11:
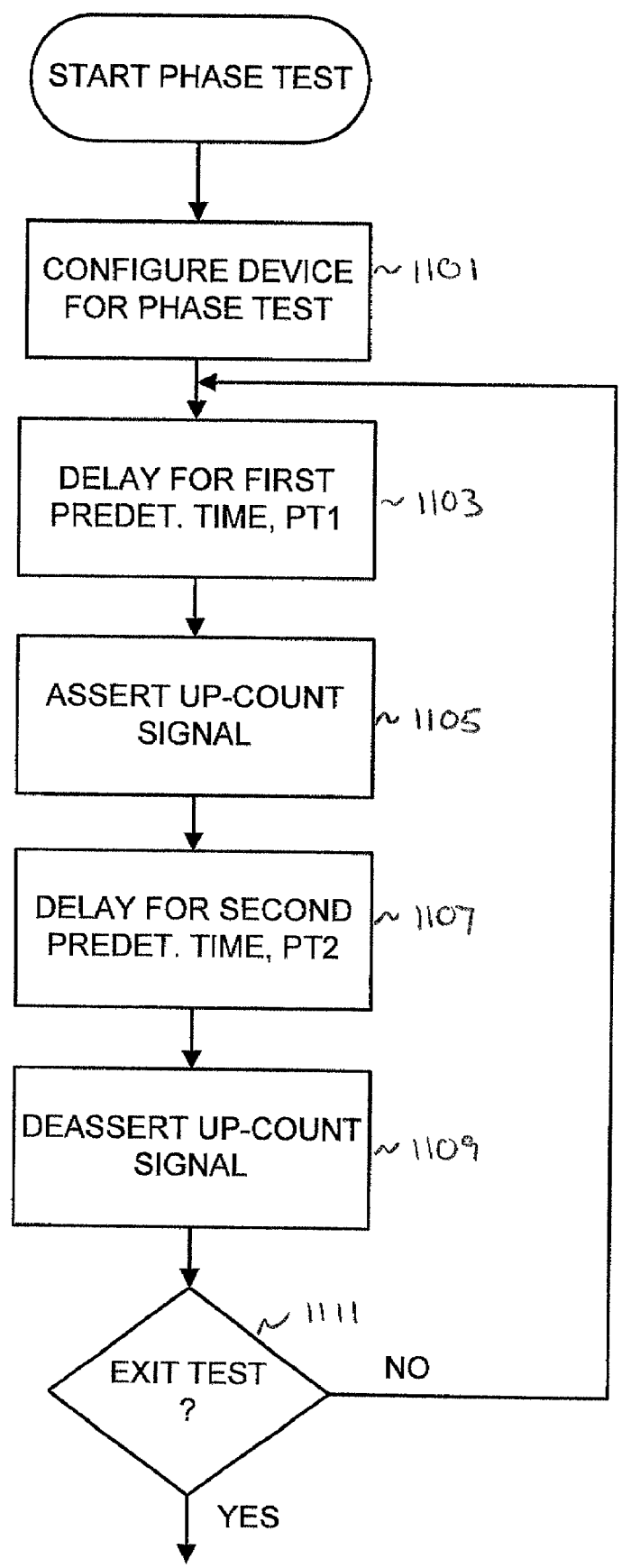
FIG. 11 is a flow diagram illustrating the operations of the test controller of FIG. 10 to perform a phase test on a CDR circuit.

FIG. 11 is a flow diagram illustrating the operations of the test controller 1001 of FIG. 10 to perform a phase test on the CDR circuit 1005 within test device 1003. At block 1101, the test controller configures the test device for a phase test. Referring to FIG. 10, configuring the test device for a phase test may include, for example, asserting a reset signal (as shown by the dashed arrow 1018 in FIG. 10), to reset the phase counter within the phase adjust circuit 1009, then asserting the CDR select signal 1012 to select the external phase control signal 1014 from the test controller 1001 to be the selected phase control signal.

Returning to FIG. 11, after configuring the test device for a phase test, the test controller delays for a first predetermined time interval, PT1. During time interval PT1, the test controller does not adjust the phase of the clock signal output by the phase adjust circuit (i.e., the test clock), so that the test clock oscillates at a substantially constant frequency and phase. At block 1105, the test controller asserts an up-count signal and leaves the up-count signal asserted for a second predetermined time, PT2 (block 1107). The phase adjust circuit responds to the up-count signal by repeatedly increasing the phase count until, at block 1109, the test controller deasserts the up-count signal. At block 1111, the test controller determines whether it has received a command (e.g., from a user or another control device) to exit the phase test. If not, then the operations of blocks 1103–1109 are repeated such that, during each time interval T1, the test clock is left to run at a selected phase offset, and during each time interval T2, the test clock is ramped to a next phase offset, each of the phase offsets being equally spaced in phase. By this arrangement, a phase plot such as shown on display 1006 of the signal measuring device 1004 of FIG. 10 may be captured. Each peak 1021 on the plot corresponds to a phase offset within a cycle of the test clock 1010 so that any differences in the time intervals between peaks (designated T1, T2, T3, T4, . . . in display 1006) is indicative of an inaccuracy in the output of the phase adjust circuit. The time interval PT2 may be selected to result in a phase increment between peaks that is as small or large as desired (or as small as can be detected by the signal measuring device 1004, or as small as the time needed to change only one phase step). Considering a phase adjust circuit capable of subdividing a test clock cycle into 256 phase offsets as an example, the time interval PT2 may be set to allow the phase counter therein to ramp by eight such that clock signals each having an incremental one of 32 different phase offsets are output during respective time intervals PT1. Each offset should be 11.25 degrees (360 degrees/32) spaced from the other and the offset times measured by the measurement device should, ideally, be (1/freq)*(32/360) seconds, where freq is the frequency of the recovered clock signal. Other ramp settings may be used to provide finer or coarser phase testing in different tests.

Figure 12:
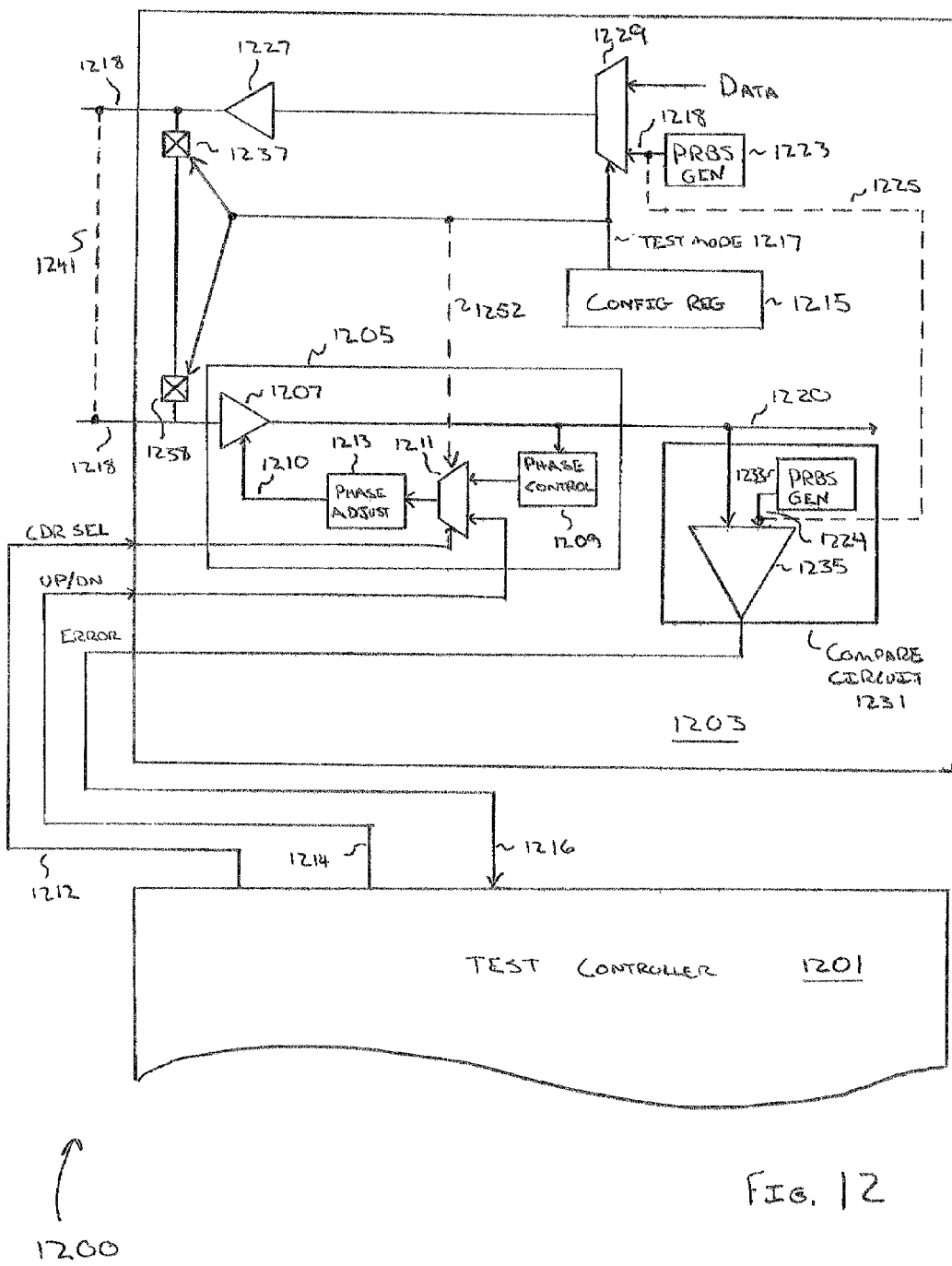
FIG. 12 illustrates an alternative test system that can be used to determine the jitter tolerance of a CDR circuit.

Returning briefly to FIG. 11, it should be noted that the signal line 1002 need not be provided to perform the phase test described in reference to FIG. 12. Accordingly, signal line 1002 may be omitted from the phase test arrangement 1000 in alternative embodiments.

FIG. 12 illustrates an alternative test system 1200 that can be used, for example, to determine the jitter tolerance of a CDR circuit 1205 within device under test 1203 (the test device). Jitter tolerance refers to the phase difference between the maximum tolerable phase offset (i.e., before reception errors begin) and the minimum tolerable phase offset of the recovered clock signal 1210. In one embodiment, the test device 1203 includes a signal generator 1223 (e.g., a pseudo-random bit sequence (PRBS) generator (typically implemented by linear feedback shift register) as shown in FIG. 12) to generate a test signal 1218. A multiplexer 1229 within the test device 1203 is responsive to a test mode signal 1217 to select the signal generator 1223 to provide an output data signal 1218 instead the circuit (or circuits) within the test device 1203 normally used to generate output data (not shown). In one embodiment, the test mode signal 1217 is asserted whenever a test mode value is stored within a device configuration register 1215 (e.g., within a storage similar to the additional configuration information portion 901 of the configuration register 215 of FIG. 9). Alternatively, the test mode signal 1217 may be supplied directly from an external device such as test controller 1201.

The test mode signal 1217 may also be coupled to switch circuits 1237 and 1238 within the test device 1203 such that, when the test mode signal 1217 is asserted, the output of transmit circuit 1227 is looped back to the input of receive circuit 1207. That is, the test device 1203 is placed in a loop-back mode with the signal generator 1223 providing the loop-back signal 1218 to the CDR circuit 1205. In alternative embodiments, the loop-back path may be made formed outside the test device 1203, for example, by a connection within the test controller 1201 or by an optical or electrical cable coupled between the transmitter circuit 1227 and receive circuit 1207 as shown by dashed line 1241. Also, the loop-back path may be made internally within the test device without passing through the transmitter circuit 1227, or even through the multiplexer 1229. For example, the signal generator 1223 may be coupled to the input of receive circuit 1207 through switch circuit 1238.

In any case, the CDR circuit 1205 is used to recover a clock signal 1210 (the test clock) and a data signal 1220 from the loop-back signal 1218. The recovered data signal 1220 is supplied to a compare circuit 1231 which compares the recovered data signal 1220 with a twin 1224 (i.e., identical version) of the original test signal 1218 to confirm that the CDR circuit is recovering the test signal 1218 without error. In one embodiment, the compare circuit 1231 includes a second signal generator (e.g., PRBS generator 1233) to generate the twin signal 1224. A comparator 1235 within the compare circuit 1231 (e.g., implemented using an exclusive OR gate) is then used to compare the recovered data signal 1220 with the twin signal 1224 and to assert an error signal 1216 if the signals do not match.

Figure 13:
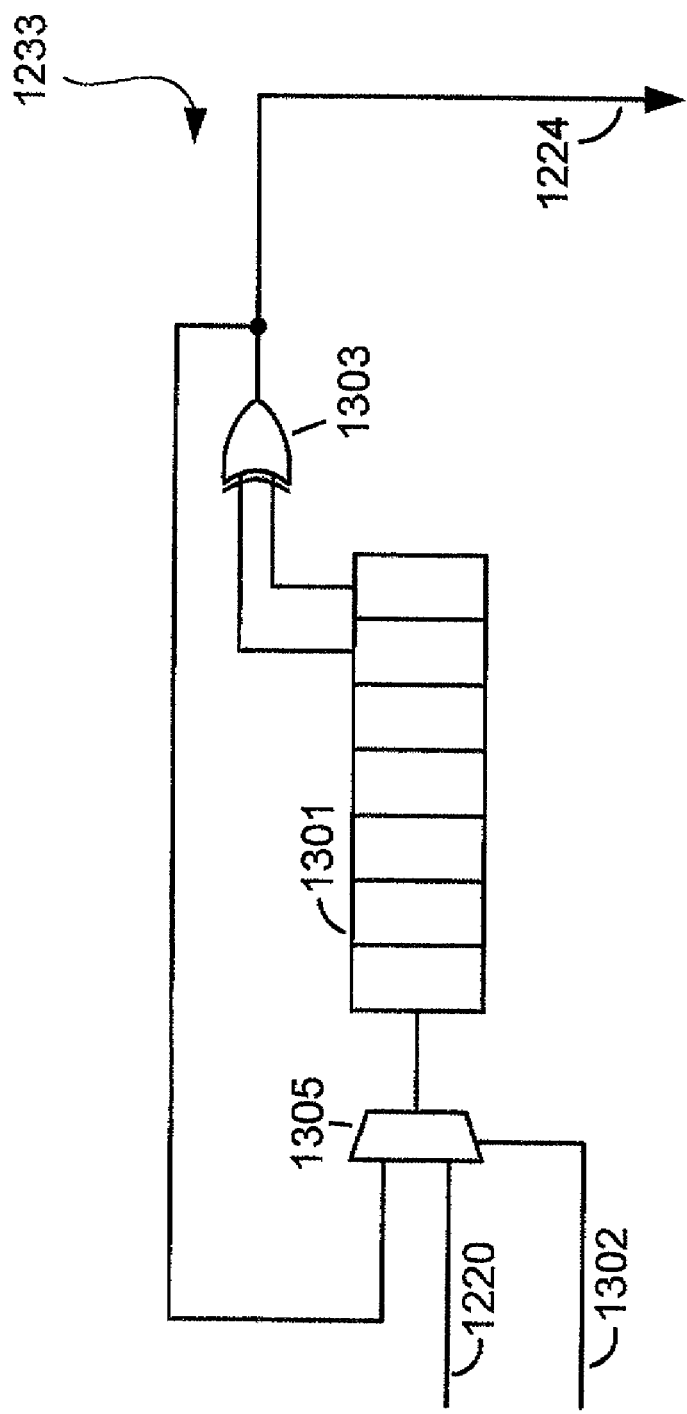
FIG. 13 illustrates an embodiment of a second signal generator which includes a shift register, an exclusive OR gate, and a multiplexer.

FIG. 13 illustrates an embodiment of the second signal generator 1233 which includes a shift register 1301, an exclusive OR gate 1303, and a multiplexer 1305. The multiplexer 1301 includes a first input port coupled to an output of the exclusive OR gate 1303, and a second input port coupled to receive the recovered data signal 1220. The exclusive OR gate 1303 is coupled to selected storage elements of the shift register 1301 (storage elements six and seven in this example, though the shift register may contain more or fewer storage elements and any of the storage elements may be coupled to the exclusive OR gate in alternative embodiments) and the output of the multiplexer 1305 is coupled to the shift register 1301. Accordingly, when the first input port of the multiplexer 1305 is selected, the exclusive OR gate 1303 and the shift register 1301 form a linear feedback shift register (LFSR) which generates a pseudo random bit sequence (i.e., twin signal 1224). During an initialization interval, preferably after the CDR circuit 1205 has attained phase lock, a preload signal 1302 is asserted to cause the multiplexer 1305 to select the recovered data signal 1220 (i.e., at the second input port) to be shifted into the shift register 1301. By this arrangement, the configuration register may be preloaded with the same value that is loaded into a shift register within the signal generator 1223 of FIG. 12, effectively synchronizing the signal generator 1233 with the signal generator 1223. After the signal generators are synchronized, the preload signal 1302 is deasserted and the LFSR circuit formed by shift register 1301 and exclusive OR gate 1303 is used to predict each new bit within the recovered data signal. Any mismatch between the output of the exclusive OR gate 1303 (i.e., the predicted, twin signal 1224) and the recovered data signal 1220 may be then detected as an error by comparator 1235 of FIG. 12.

Returning to FIG. 12, in an alternative embodiment, the signal generator 1223 may be used to supply the twin signal 1224 to the compare circuit as shown by dashed line 1225, and the second signal generator 1233 omitted. In such an embodiment, it may be desirable to delay the twin signal delivered through path 1225 so that the recovered data signal 1220 and the twin signal arrive at the comparator circuit 1235 during the same clock cycle (or portion of a clock cycle).

As in the test arrangement depicted in FIG. 10, the test device 1203 may be an integrated circuit and the test controller 1201 a separate general purpose test device (e.g., automated test equipment (ATE)). Alternatively, the test controller 1201 may also be an integrated circuit device, or a device that is incorporated into the same integrated circuit or integrated circuit package as the test device 1203.

Figure 14:
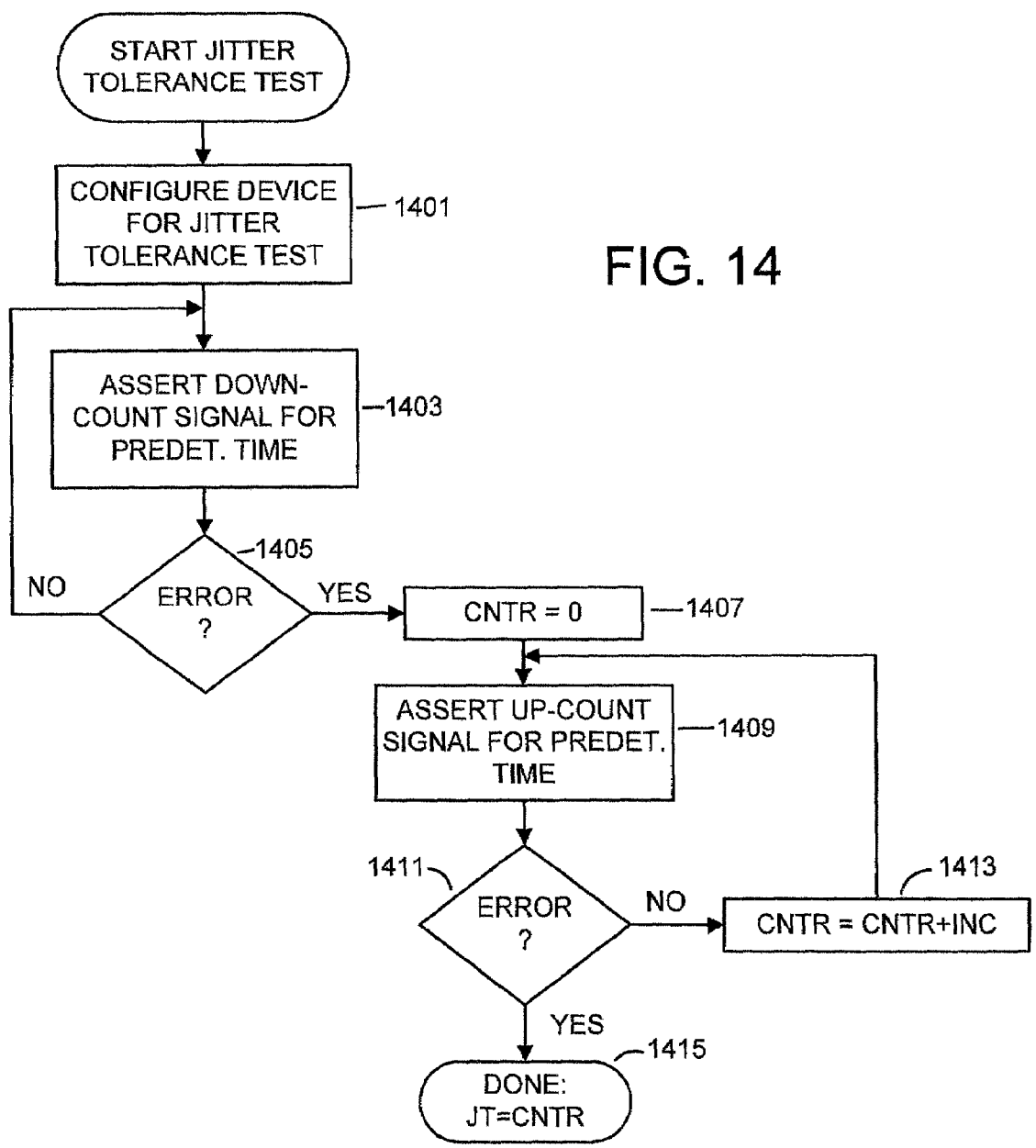
FIG. 14 illustrates the operations of the test controller of FIG. 12 in performing a jitter tolerance test on a CDR circuit 1205.

FIG. 14 illustrates the operations of the test controller 1201 of FIG. 12 in performing a jitter tolerance test on the CDR circuit 1205 within the test device 1203. At block 1401, the test controller configures the test device for a jitter tolerance test. Referring to FIG. 12, the actions involved in configuring the test device for jitter tolerance test may include, without limitation, (1) setting the test device to a test mode (e.g., by asserting a test mode signal 1217 or loading an appropriate configuration value into the configuration register 1215 to cause the test mode signal 1217 to be asserted), (2) setting the CDR select signal 1212 to select the self-controlled mode of operation for the CDR circuit 1205 (i.e., phase control signal supplied by the phase control circuit 1209), (3) delaying for a predetermined time to allow the CDR circuit 1205 to attain phase lock (or alternatively, delaying until the CDR circuit 1205 or another circuit block within the test device 1203 indicates that phase lock has been attained), and (4) after phase lock is attained, setting the CDR select signal 1212 to select the slave mode of operation (i.e., phase control signal 1214 supplied by the test controller). Referring to FIG. 13, the test controller may also assert (or configure the test device to assert) the preload signal 1302 for a predetermined time to synchronize the signal generator 1233 within the compare circuit 1231 to the signal generator 1223.

After the test device has been configured for the jitter tolerance test in block 1401, the test controller asserts a down-count signal in block 1403 for a predetermined time interval, T1. In one embodiment, the duration of time interval T1 is selected such that the phase count within the phase adjust circuit (e.g., element 1213 of FIG. 12) is decremented by one. In decision block 1405, the test controller monitors the error status of the test device (e.g., by sampling the error signal 1216 output from the test device, by reading a status value from the test device, etc.) for a predetermined time interval, T2, to determine whether the CDR circuit is still properly recovering the test signal at the new phase offset setting. In one embodiment, the duration of time interval T2 is selected to allow a statistically sufficient number of samples of the test signal to be captured by the CDR circuit (and compared with the twin signal in the compare circuit 1231) to determine whether reception errors are occurring. If no error is detected in decision block 1405, then the down-count signal is asserted again in a repetition of block 1403 to set an incrementally more delayed phase offset for the test clock 1210, and error monitoring is performed again in block 1405. Blocks 1403 and 1405 are repeated in this manner until the phase offset of the test clock is delayed to a point at which an error is detected. When this occurs, a counter within the test controller is set to zero to mark the most delayed (i.e., minimum) phase offset at which the CDR circuit was still properly recovering data. At block 1409, the up-count signal is asserted for the predetermined time interval, T1, to select an incrementally more advanced phase of the test clock. At block 1411, the error status of the test device is evaluated in the same manner as in block 1405 to determine whether reception errors have occurred. Because the test clock has just been advanced back into the passing range of phase offsets, no error is determined in the initial pass through decision block 1411. Accordingly, at block 1413, the counter is incremented by an increment value that corresponds to the increment in the phase count value within the CDR circuit 1205 that resulted from assertion of the up-count signal in block 1409 (i.e., the counter maintained by the test controller and the counter within the phase adjust circuit of the test device are incremented in lock step). Blocks 1409, 1411 and 1413 are then repeated, incrementing the phase offset with each repetition, until a phase error is detected in decision block 1411. At this point the value of the counter within the test controller is representative of the number of increments in phase between a minimum tolerable phase offset and a maximum tolerable phase offset. That is, as shown in termination block 1415, the jitter tolerance of the CDR circuit within the test device is specified by the counter value within the test controller. Note that the actions used to perform jitter tolerance testing may be altered in numerous ways. For example, a count of the number of executions of block 1403 (i.e., a decrement count) may be maintained so that, upon detecting the minimum tolerable phase offset at block 1405, the up-count signal may be asserted for a time interval corresponding to the decrement count to return the phase offset of the test clock to its initial value. Thereafter, the phase offset of the test clock may be incremented in iterative executions of steps 1409, 1411 and 1413 to determine the maximum tolerable phase offset of the test clock. In such an embodiment, the count value incremented in block 1413 (i.e., the increment count) is indicative of the phase difference between the phase offset at phase lock and the maximum tolerable phase offset, while the decrement count is indicative of the phase difference between the phase offset at phase lock and the minimum tolerable phase offset. Accordingly, the jitter tolerance of the CDR circuit may be determined by summing the decrement count and increment count.

The phase test and jitter tolerance test described above are but two instances of numerous different tests that may be performed using embodiments of the present invention. Moreover, while the phase test and the jitter tolerance test have been described in reference to digital implementations of a CDR circuit, the tests may be carried out using analog control signals to control the phase of an analog phase adjust circuit in alternative embodiments.

Although the invention has been described with reference to specific exemplary embodiments thereof, it will be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An integrated circuit device comprising:
   a first clock data recovery (CDR) circuit to recover clock and data signals from a first signal line, the first CDR circuit including:
   a first phase control circuit to generate a first control signal, and
   a first phase adjust circuit to adjust the phase of a first recovered clock signal in response to the first control signal; and
   a second CDR circuit to recover clock and data signals from a second signal line, the second CDR circuit including:
   a second phase control circuit to generate a second control signal,
   a select circuit coupled to receive the first and second control signals and being responsive to a select signal to select from one of the first control signal and the second control signal to be output as a selected control signal, and
   a second phase adjust circuit to adjust the phase of a second recovered clock signal in response to the selected control signal.

2. The integrated circuit device of claim 1 wherein the select circuit comprises a multiplexer circuit having a control input coupled to receive the select signal and having respective input ports coupled to receive the first and second control signals from the first and second phase control circuits.

3. The integrated circuit device of claim 1 further comprising additional CDR circuits each having a respective phase control circuit, select circuit and phase adjust circuit, the select circuit of each of the additional CDR circuits being responsive to a control input to output, as a selected control signal, from one of the first control signal and a phase control signal output by the phase control circuit of the additional CDR circuit, the phase adjust circuit of each of the additional CDR circuits being responsive to the selected control signal output by the select circuit for the additional CDR circuit to adjust the phase of a respective recovered clock signal.

4. The integrated circuit device of claim 1 wherein the first CDR circuit further includes a first receive circuit to sample an input signal on the first signal line in response to the first recovered clock signal, and the second CDR circuit further includes a second receive circuit to sample an input signal on the second signal line in response to the second recovered clock signal.

5. The integrated circuit device of claim 1 further comprising an input to receive the select signal from an external device.

6. The integrated circuit device of claim 1 further comprising a programmable register to store a mode value, the select signal having from one of a first state and a second state according to the mode value, and the select circuit including a circuitry to select the first control signal when the select signal is in the first state and to select the second control signal when the select signal is in the second state.

7. The integrated circuit device of claim 1 wherein the select circuit is responsive to the select signal to disable generation of the first control signal when the select signal indicates that the select circuit is to select the second control signal to be output as the selected control signal.

8. A method of controlling an integrated circuit, the method comprising:
  outputting a first command to the integrated circuit to set a first clock data recovery (CDR) circuit within the integrated circuit to a first mode, the first CDR circuit including a select circuit to select a first control signal to adjust the phase of a first clock signal when the first CDR circuit is in the first mode;
  delaying for a first time interval; and
  outputting, after the first time interval, a second command to the integrated circuit to set the first CDR circuit to a second mode, the select circuit of the first CDR circuit to select a second control signal when the first CDR circuit is in the second mode, the second control signal being generated by a second CDR circuit.

9. The method of claim 8 wherein delaying for the first time interval comprises delaying until a predetermined number of cycles of a clock signal have transpired.

10. The method of claim 8 wherein outputting the first command to the integrated circuit to set the first CDR circuit to the first mode comprises outputting a command to the integrated circuit to store a mode value in a programmable register within the integrated circuit, the mode value indicating the first mode.

11. The method of claim 8 wherein outputting the first command to the integrated circuit to set the first CDR circuit to the first mode comprises outputting a mode signal to the integrated circuit, the mode signal being input to a select input of the select circuit to select the first control signal.

12. The method of claim 8 further comprising periodically repeating the outputting the first command to the integrated circuit, delaying for the first time interval, and outputting the second command to the integrated circuit.

13. The method of claim 8 further comprising:
  detecting a predetermined condition; and
  in response to the detecting the predetermined condition, repeating the outputting the first command to the integrated circuit, delaying for the first time interval, and outputting the second command to the integrated circuit.

14. The method of claim 13 wherein the detecting the predetermined condition comprises detecting a change in temperature.

15. The method of claim 13 wherein the detecting the predetermined condition comprises detecting a change in voltage.

16. The method of claim 13 wherein the detecting the predetermined condition comprises detecting a loss of synchronization between the first clock signal and a data signal received in the first CDR circuit.

17. A system comprising:
  a first signal line;
  a receive device coupled to the first signal line, the receive device having a first clock data recovery (CDR) circuit to recover clock and data signals from the first signal line, the first CDR circuit including a control circuit, a select circuit and a phase adjust circuit, the control circuit to generate a first control signal according to a phase relationship between an input signal on the first signal line and a first clock signal, the select circuit being responsive to a first mode value to select from one of the first control signal and a second control signal to be output as a selected control signal, the phase adjust circuit to adjust the phase of the first clock signal according to the selected control signal;
  a control device coupled to the receive device to provide the first mode value; and
  at least one additional signal line, the at least one additional signal line coupled to the receive device and to the control device, the control device provides the first mode value to the receive device via the at least one additional signal line.

18. The system of claim 17 wherein the control device is coupled to provide the first mode value to the receive device via the first signal line.

19. The system of claim 17 wherein the control device outputs the first mode value to the receive device and then, after a first time interval, outputs a second mode value to the receive device, the select circuit being responsive to the first mode value to select the first control signal to be output as the selected control signal, the select circuit being responsive to the second mode value to select the second control signal to be output as the selected control signal.

20. The system of claim 17 wherein the receive device is implemented in a first integrated circuit and the control device is implemented in a second integrated circuit.

21. The system of claim 20 wherein the first and second integrated circuits are packaged in separate integrated circuit packages.

22. The system of claim 20 wherein the first and second integrated circuits are packaged in the same integrated circuit package.

23. The system of claim 17 wherein the receive device and the control device are implemented within a single integrated circuit.

24. A system comprising:
  a first signal line;
  a receive device coupled to the first signal line, the receive device having a first clock data recovery (CDR) circuit to recover clock and data signals from the first signal line, the first CDR circuit including a control circuit, a select circuit and a phase adjust circuit, the control circuit to generate a first control signal according to a phase relationship between an input signal on the first signal line and a first clock signal, the select circuit being responsive to a first mode value to select from one of the first control signal and a second control signal to be output as a selected control signal, the phase adjust circuit to adjust the phase of the first clock signal according to the selected control signal;

a control device coupled to the receive device to provide the first mode value;

wherein the control device outputs the first mode value to the receive device and then, after a first time interval, outputs a second mode value to the receive device, the select circuit being responsive to the first mode value to select the first control signal to be output as the selected control signal, the select circuit being responsive to the second mode value to select the second control signal to be output as the selected control signal; and a second signal line coupled to the receive device, and wherein the receive device includes a second CDR circuit to recover clock and data signals from the second signal line, the second CDR circuit including a control circuit to generate the second control signal according to a phase relationship between an input signal on the second signal line and a second clock signal.

25. A method of testing an integrated circuit (IC) that includes a clock data recovery (CDR) circuit and a phase control port, the method comprising:

outputting a command to the IC to set the CDR circuit to a mode of operation, the CDR circuit having a select circuit that responds to the mode of operation by selecting the phase control port to source a control signal instead of a phase control circuit within the CDR circuit, the control signal used by a phase adjust circuit within the CDR circuit to adjust the phase of a clock signal;

outputting a phase control signal to the phase control port of the integrated circuit device to adjust the phase of the clock signal; and wherein outputting the first command to the integrated circuit to set the CDR circuit to the mode of operation comprises outputting a command to the integrated circuit to store a mode value in a programmable register within the integrated circuit, the mode value indicating the mode of operation.

26. A method of testing an integrated circuit (IC) that includes a clock data recovery (CDR) circuit and a phase control port, the method comprising:

outputting a command to the IC to set the CDR circuit to a mode of operation, the CDR circuit having a select circuit that responds to the mode of operation by selecting the phase control port to source a control signal instead of a phase control circuit within the CDR circuit, the control signal used by a phase adjust circuit within the CDR circuit to adjust the phase of a clock signal;

asserting a phase control signal at the phase control port of the integrated circuit for a first predetermined time interval, the phase adjust circuit within the CDR circuit responsive to the phase control signal to adjust the phase of the clock signal;

deasserting the phase control signal for a second predetermined time interval; and measuring the clock signal with a signal measuring device while repeating asserting a phase control signal and deasserting the phase control signal at least until the phase of the clock signal has progressed through a predetermined portion of a cycle of the clock signal.

27. The method of claim 26 wherein the predetermined portion of a cycle of the clock signal is an entire cycle of the clock signal.

28. The method of claim 26 wherein the phase adjust circuit responds to assertion of the control signal by advancing the phase of the clock signal.

29. The method of claim 26 wherein the first predetermined time interval is selected to allow the phase adjust circuit to advance the phase of the clock signal by a predetermined phase angle.

30. The method of claim 26 wherein measuring the clock signal with a signal measuring device comprises measuring the clock signal with an oscilloscope.

31. A method of testing an integrated circuit that includes a clock data recovery (CDR) circuit and a phase control port, the method comprising:

setting the CDR circuit to a test mode in which a select circuit within the CDR circuit selects the phase control port to source a control signal instead of a phase control circuit within the CDR circuit, the control signal used by a phase adjust circuit within the CDR circuit to adjust the phase of a first clock signal;

inputting a test signal to a receiver of the CDR circuit;

comparing the test signal against samples of the test signal generated by the CDR circuit;

asserting an error signal when the test signal does not match the samples;

asserting a phase control signal at the phase control port to adjust the phase of the first clock signal; and repeating comparing the test signal, asserting an error signal and asserting a phase control signal to determine a maximum phase and a minimum phase of the first clock signal for which the error signal is not asserted.

* * * * *